United States Patent [19]
Noda et al.

[11] Patent Number: 5,615,823
[45] Date of Patent: Apr. 1, 1997

[54] SOLDERING BALL MOUNTING APPARATUS AND METHOD

[75] Inventors: Kazuhiro Noda, Chikushino; Siniti Nakazato, Fukuoka, both of Japan

[73] Assignee: Matsushita Electric Industrial Co., Ltd., Osaka, Japan

[21] Appl. No.: 506,747

[22] Filed: Jul. 26, 1995

[30] Foreign Application Priority Data

Jul. 26, 1994 [JP] Japan .................................. 6-173993
Nov. 7, 1994 [JP] Japan .................................. 6-272158

[51] Int. Cl.⁶ .......................... B23K 1/00; B23K 31/02
[52] U.S. Cl. ........................ 228/103; 228/41; 228/56.5; 228/246
[58] Field of Search ............................ 228/10, 41, 56.5, 228/246, 103

[56] References Cited

U.S. PATENT DOCUMENTS 5,467,913  11/1995  Namekawa et al. .................... 228/246

OTHER PUBLICATIONS

A. S. Cammarano et al., "Optical Testing of Solder Pads," *IBM Tech. Discl. Bull.*, vol. 21, No. 7 (Dec. 1978) pp. 2914–2915.

"Illumination Method For Chip Inspection," *IBM Tech. Discl. Bull.*, vol. 32, No. 12 (May, 1990) pp. 223–224.

*Primary Examiner*—P. Austin Bradley
*Assistant Examiner*—Jeffrey T. Knapp
*Attorney, Agent, or Firm*—Lowe, Price, LeBlanc & Becker

[57] ABSTRACT

In a soldering ball mounting apparatus, a pickup head is movable between a soldering ball feeder and a workpiece to be mounted with soldering balls. The pickup head has a bottom formed with a large number of absorber holes for vacuum-absorbing the soldering balls from the soldering ball feeder. On the way to the workpiece, light is irradiated onto the bottom of the pickup head from the exterior. When the light leaks into the pickup head, the leakage light is detected by a light detector provided in the pickup head so that presence of a soldering-ball pickup error is determined. On the other hand, on the way to the soldering ball feeder after mounting the soldering balls onto the workpiece, light is irradiated along the bottom of the pickup head from one side. Accordingly, when the light is not received at the opposite side, at least one soldering ball remains attached to the bottom of the pickup head so that presence of a soldering-ball mounting error is determined.

12 Claims, 11 Drawing Sheets a1=2°-20°

$a2 = 2° \sim 15°$

SOLDERING BALL MOUNTING APPARATUS AND METHOD

BACKGROUND OF THE INVENTION

1. Field of the Invention

The present invention relates to a soldering ball mounting apparatus and a soldering ball mounting method, wherein soldering balls are vacuum-absorbed by a pickup head and then mounted onto a workpiece.

2. Description of the Prior Art

It is known to form bumps (protruding electrodes) on a surface of a workpiece, such as, a chip or a substrate, by mounting soldering balls onto the surface of the workpiece, heating to melt the mounted soldering balls and then cooling the molten soldering balls to solidify. In general, a large number of bumps are formed on the workpiece so that a large number of soldering balls are mounted on the workpiece.

Hereinbelow, a conventional soldering ball mounting apparatus for mounting a large number of soldering balls onto the workpiece at a time will be explained with reference to FIG. 18.

FIG. 18 is a side view schematically showing the conventional soldering ball mounting apparatus. In the figure, soldering balls 1, each as a material for a bump or a bump electrode, are stored in a container 2. Numeral 3 denotes a pickup head which is driven by up-and-down moving means (not shown) so as to be movable in the vertical directions, that is, upward and downward. The pickup head 3 has a bottom wall formed with a large number of absorber openings or holes for absorbing the soldering balls 1 thereat by a vacuum suction force when the pickup head 3 is lowered from an initial position to a given low level. The pickup head 3 is further driven by horizontally-moving means (not shown) so as to be movable in the horizontal directions. Specifically, the pickup head 3 moves from the initial position to just above the workpiece, such as, a substrate 5 which is firmly clamped in position by a clamper 6. The pickup head 3 is then lowered to a given low level and releases the absorbed soldering balls so as to mount them on given locations on the surface of the substrate 5.

As appreciated, it is necessary that the soldering balls 1 be picked up by all the absorber holes formed at the bottom wall of the pickup head 3 and all the picked-up soldering balls be mounted on the surface of the substrate 5. Accordingly, in the conventional technique, a camera 4 is disposed under the moving path of the pickup head 3 so as to monitor the bottom wall of the pickup head 3 from below. Specifically, image data sent from the camera 4 are processed to determine whether all the absorber holes hold the soldering balls 1. If positive, the pickup head 3 further moves to just above the substrate 5 and is then lowered to mount the soldering balls 1 on the substrate 5.

However, in the foregoing conventional technique, determination of presence or absence of the soldering ball which is small, is difficult due to, for example, flickering or noise in the image data sent from the camera 4 so that a determination error is liable to occur. Further, in general, as described above, a large number (for example, several tens or more) of the soldering balls 1 are vacuum-absorbed by the pickup head 3. Thus, it takes a considerable time to check whether the soldering balls 1 are absorbed or not with respect to all the absorber holes. This deteriorates the working efficiency.

Further, all the soldering balls picked up by the pickup head are not always mounted onto the workpiece due to a mounting error. Accordingly, it is possible that some soldering balls may remain attached to the corresponding absorber holes of the pickup head. In this case, the processed workpiece becomes defective as lacking some soldering balls thereon.

However, in the conventional technique, there has been no means provided for automatically detecting such a mounting error so that problems, including the production of the defective workpieces, caused by the mounting error, are liable to occur.

SUMMARY OF THE INVENTION

Therefore, it is an object of the present invention to provide an apparatus for and a method of mounting soldering balls onto a workpiece with high reliability. More specifically, it is an object of the present invention to provide a soldering ball mounting apparatus and a soldering ball mounting method which can accurately judge whether or not a pickup head causes a pickup error of soldering balls, and further, it is an object of the present invention to provide a soldering ball mounting apparatus and a soldering ball mounting method which can easily judge whether or not soldering balls picked up by a pickup head are all mounted onto a workpiece.

According to one aspect of the present invention, a soldering ball mounting apparatus comprises a pickup head movable along a moving path between a soldering ball feeder and a workpiece, the pickup head being in the form of a dark box having a bottom which is formed with a plurality of absorber holes for vacuum-absorbing soldering balls from the soldering ball feeder and mounting the soldering balls onto the workpiece; light detecting means provided in the dark box for detecting light leaking into the dark box via at least one of the absorber holes; and light emitting means provided near the moving path for irradiating the light toward the bottom of the pickup head.

According to another aspect of the present invention, a soldering ball mounting method in which a pickup head is movable along a moving path between a soldering ball feeder and a workpiece and includes a bottom formed with a plurality of absorber holes for vacuum-absorbing soldering balls from the soldering ball feeder and mounting the soldering balls onto the workpiece, comprises the steps of irradiating light toward the bottom of the pickup head while the pickup head moves from the soldering ball feeder to the workpiece for mounting the soldering balls onto the workpiece; and determining presence of a soldering-ball pickup error by the pickup head when the light leaking into the pickup head via at least one of the absorber holes is detected by light detecting means provided in the pickup head.

According to another aspect of the present invention, a soldering ball mounting apparatus comprises a pickup head movable along a moving path between a soldering ball feeder and a workpiece, the pickup head being in the form of a dark box having a bottom which is formed with a plurality of absorber holes for vacuum-absorbing soldering balls from the soldering ball feeder and mounting the soldering balls onto the workpiece; and detecting means provided near the moving path for irradiating light along the bottom of the pickup head while the pickup head returns from the workpiece to the soldering ball feeder after mounting the soldering balls onto the workpiece, and for detecting presence or absence of the soldering ball attached to the bottom of the pickup head based on presence or absence of interception of the irradiated light.

According to another aspect of the present invention, a soldering ball mounting method in which a pickup head includes a bottom formed with a plurality of absorber holes for vacuum-absorbing soldering balls from a soldering ball feeder and mounting the soldering balls onto a workpiece, comprises the steps of monitoring the bottom of the pickup head after mounting the soldering balls onto the workpiece; and determining presence of a soldering-ball mounting error by the pickup head when at least one of the soldering balls is detected at the bottom of the pickup head.

According to another aspect of the present invention, a soldering ball mounting apparatus comprises a pickup head movable along a moving path between a soldering ball feeder and a workpiece, the pickup head being in the form of a dark box having a bottom which is formed with a plurality of absorber holes for vacuum-absorbing soldering balls from the soldering ball feeder and mounting the soldering balls onto the workpiece; light detecting means provided in the dark box for detecting light leaking into the dark box via at least one of the absorber holes; light emitting means provided near the moving path for irradiating the light toward the bottom of the pickup head while the pickup head moves toward the workpiece for mounting the soldering balls onto the workpiece; and detecting means provided near the moving path for irradiating light along the bottom of the pickup head while the pickup head returns from the workpiece to the soldering ball feeder after mounting the soldering balls onto the workpiece, and for detecting presence or absence of the soldering ball attached to the bottom of the pickup head based on presence or absence of interception of the light irradiated along the bottom.

According to another aspect of the present invention, a soldering ball mounting apparatus comprises a pickup head movable along a moving path between a soldering ball feeder and a workpiece, the pickup head being in the form of a dark box having a bottom which is formed with a plurality of absorber holes for vacuum-absorbing soldering balls from the soldering ball feeder and mounting the soldering balls onto the workpiece; light detecting means provided in the dark box for detecting light leaking into the dark box via at least one of the absorber holes; first light emitting means provided in the dark box; second light emitting means provided near the moving path for irradiating the light toward the bottom of the pickup head; and light receiving means provided near the moving path for detecting light emitted from the first light emitting means and leaking out of the dark box via the absorber holes.

According to another aspect of the present invention, a soldering ball mounting method in which a pickup head includes a bottom formed with a plurality of absorber holes for vacuum-absorbing soldering balls from a soldering ball feeder and mounting the soldering balls onto a workpiece, comprises the steps of monitoring light emitted from light emitting means provided in the pickup head and leaking out of the pickup head via the absorber holes after mounting the soldering balls onto the workpiece; and determining presence of a soldering-ball mounting error by the pickup head when no leakage light is detected with respect to at least one of the absorber holes.

BRIEF DESCRIPTION OF THE DRAWINGS

The present invention will be understood more fully from the detailed description given hereinbelow, taken in conjunction with the accompanying drawings.

In the drawings.

DESCRIPTION OF THE PREFERRED EMBODIMENT

Now, preferred embodiments of the present invention will be described hereinbelow with reference to the accompanying drawings. The same or like components are represented by the same reference symbols throughout the figures.

Figure 1:
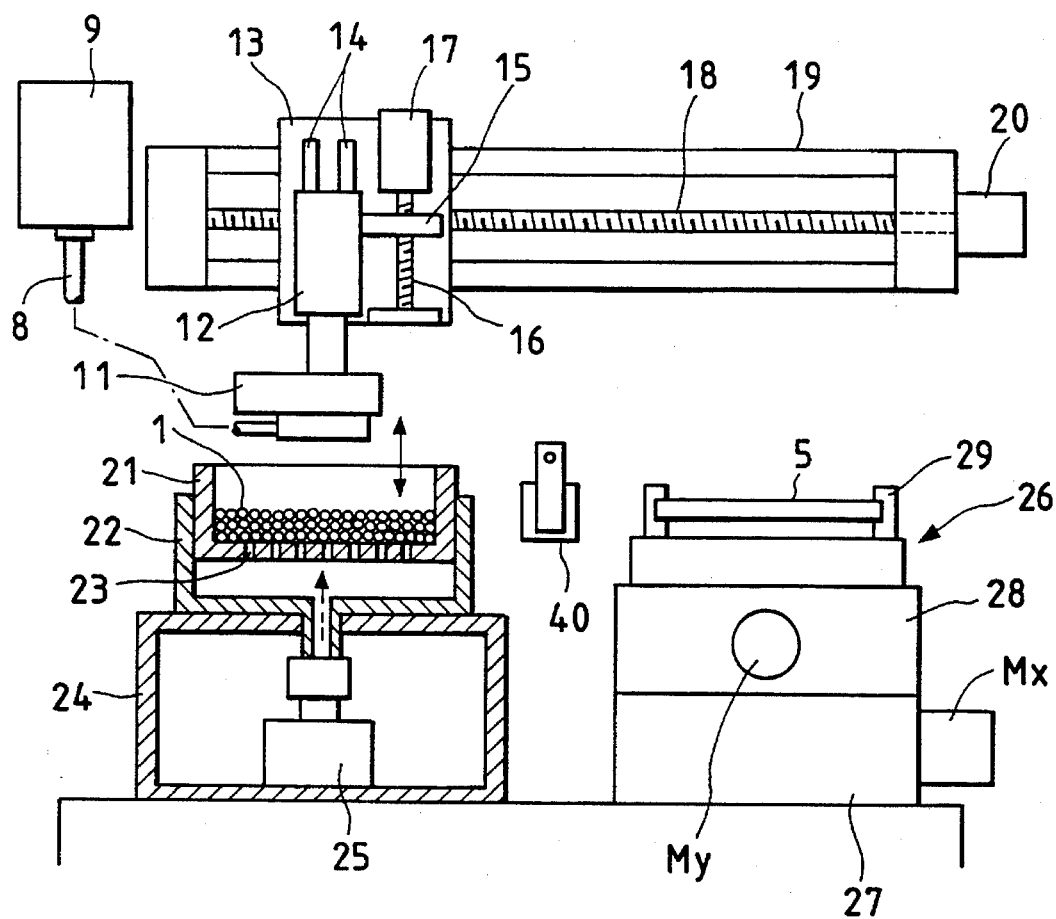
FIG. 1 is a side view showing a soldering ball mounting apparatus according to a first embodiment of the present invention.
Figure 2:
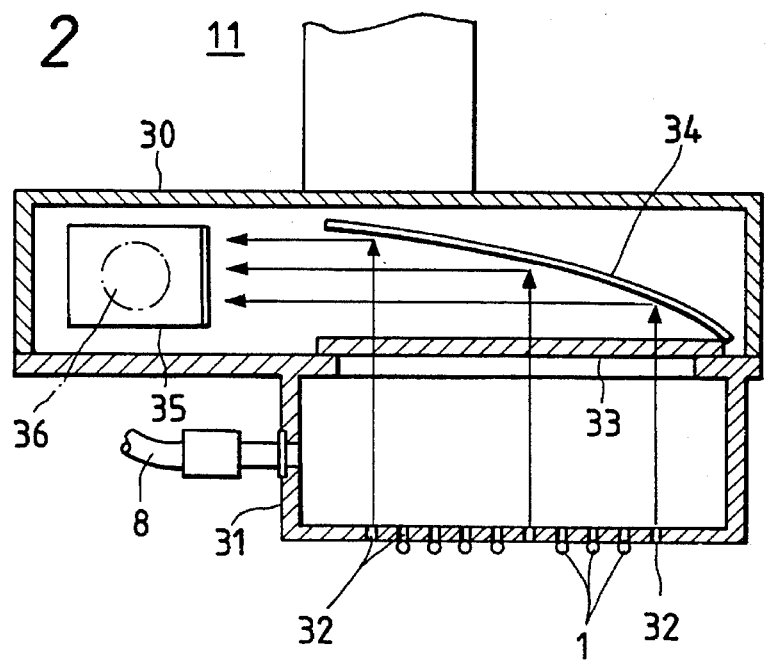
FIG. 2 is a vertical sectional view of a pickup head incorporated in the soldering ball mounting apparatus shown in FIG. 1.
Figure 3:
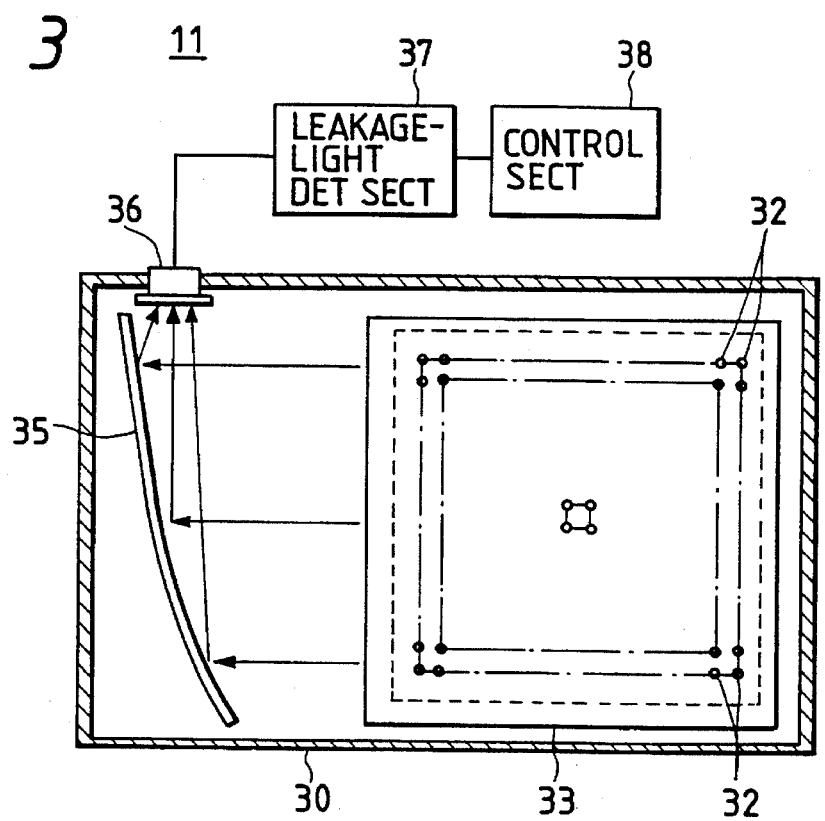
FIG. 3 is a horizontal sectional view of the pickup head shown in FIG. 2.
Figure 4:
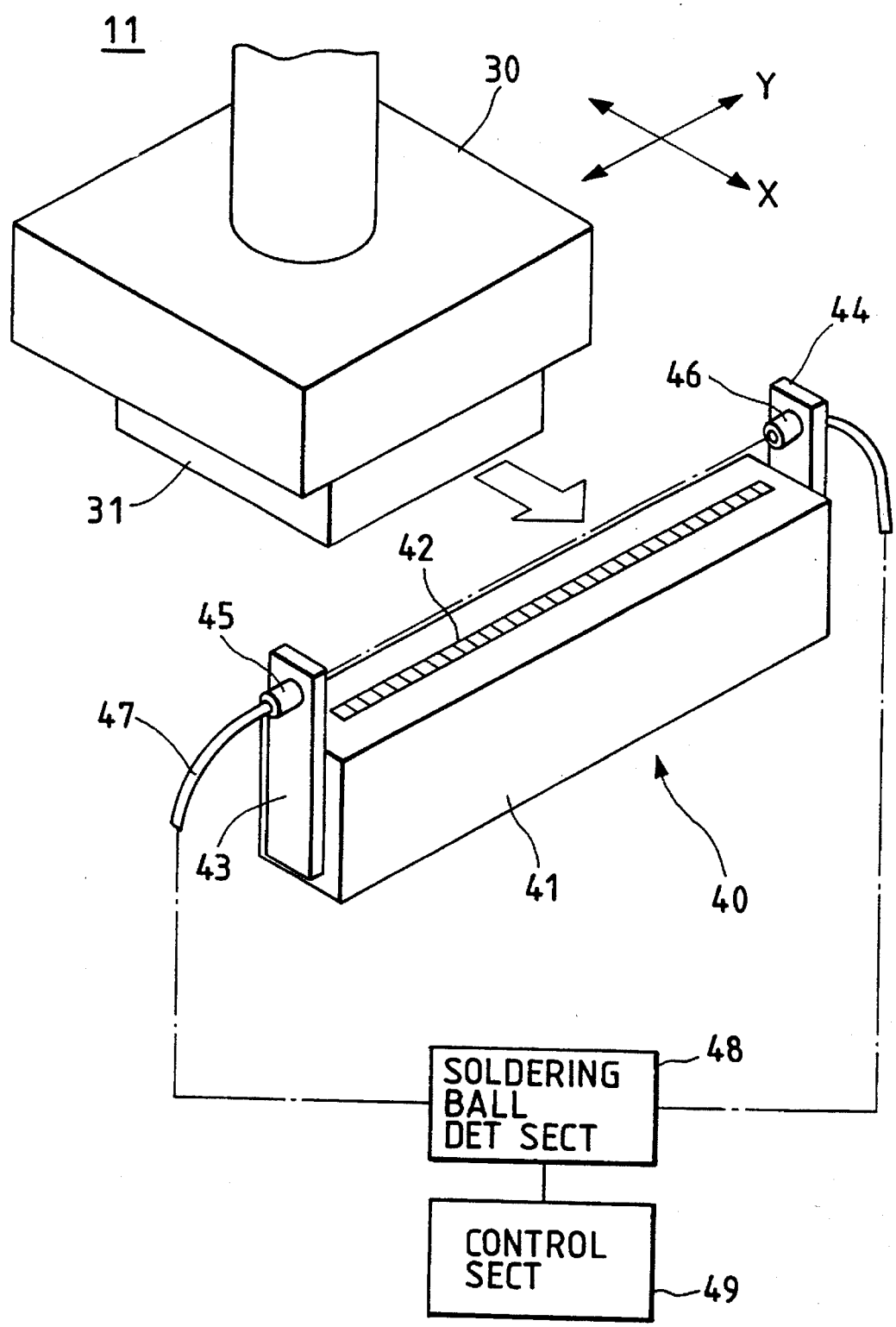
FIG. 4 is a perspective view showing the pickup head shown in FIGS. 1 to 3 and a light emitter incorporated in the soldering ball mounting apparatus shown in FIG. 1.
Figure 5:
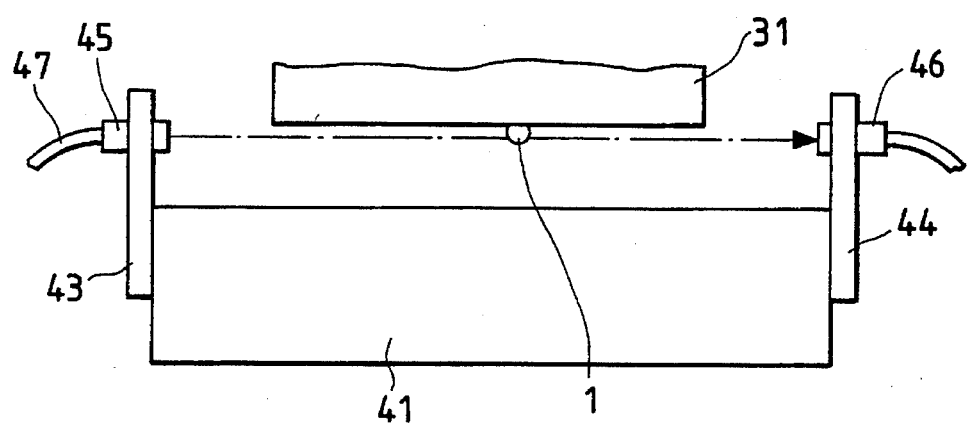
FIG. 5 is a front view of the light emitter shown in FIG. 4.

FIG. 1 is a side view showing a soldering ball mounting apparatus according to a first embodiment of the present invention. FIG. 2 is a vertical sectional view of a pickup head incorporated in the soldering ball mounting apparatus shown in FIG. 1. FIG. 3 is a horizontal sectional view of the pickup head shown in FIG. 2. FIG. 4 is a perspective view showing the pickup head shown in FIGS. 1 to 3 and a light emitter incorporated in the soldering ball mounting apparatus shown in FIG. 1. FIG. 5 is a front view of the light emitter shown in FIG. 4.

In FIG. 1, numeral 11 denotes the pickup head which is held by a block 12. The block 12 is mounted on two guide rails 14 provided on a front surface of a bracket 13, so as to be movable vertically, that is, upward and downward. The block 12 is integrally provided on its side surface with a nut 15 which is engaged with a vertical feed screw 16 passing therethrough. When a motor 17 is rotated in the forward or reverse direction to rotate the feed screw 16 in the forward or reverse direction, the pickup head 11 moves downward or upward along the guide rails 14.

The bracket 13 is integrally provided on its rear surface with a nut (not shown) which is engaged with a horizontal feed screw 18 passing therethrough. Numeral 19 denotes a holder table holding the feed screw 18. When a motor 20 is rotated in the forward or reverse direction to rotate the feed screw 18 in the forward or reverse direction, the bracket 13 and thus the pickup head 11 moves horizontally in an X direction (see FIG. 4).

Under a moving path of the pickup head 11 is disposed a soldering ball feed section 21 which is in the form of a container and supported by a box 22. The feed container 21 has a bottom wall formed with a plurality of openings or holes 23. The box 22 is mounted on a base 24 which accommodates therein a gas blowing unit 25. Gas, such as, air, blown off from the gas blowing unit 25 is introduced into the feed container 21 via the holes 23 (see a broken-line arrow in FIG. 1) so as to cause the soldering balls 1 to be mobile due to pressures of the introduced gas. In this condition, the pickup head 11 is lowered from an initial position to a given low level so as to pick up the soldering balls 1 by vacuum-absorbing them to a lower surface of the bottom wall thereof. As appreciated, the mobile state of the soldering balls 1 facilitates the absorption of the soldering balls 1. In order to achieve the mobile state of the soldering balls 1, It may be arranged to vibrate the feed container 21 using a vibrator, instead of introducing the gas into the feed container 21.

A positioning section 26 for the substrate 5 Is arranged spacing a given distance from the feed container 21 along the moving path of the pickup head 11. The positioning section 26 includes an X table 27 and a Y table 28 mounted on the X table 27. The positioning section 26 further includes a clamper 29 which is mounted on the Y table 28 for clamping or firmly holding the substrate 5. When a motor Mx of the X table 27 is driven, the substrate 5 displaces in the X direction (see FIG. 4), while, when a motor My of the Y table 28 is driven, the substrate 5 displaces in a Y direction (see FIG. 4). By moving the substrate 5 in the horizontal directions, its position is adjusted.

Now, referring to FIGS. 2 and 3, a structure of the pickup head 11 will be described hereinbelow.

The pickup head 11 is in the form of a dark box constituted by an upper case 30 and a lower case 31. The lower case 31 has a bottom wall which is formed with a large number of absorber openings or holes 32, arranged in a matrix, for vacuum-absorbing the soldering balls 1. A bottom wall of the upper case 30, which also forms an upper wall of the lower case 31, is formed with a rectangular (square in this embodiment) opening, and a transparent plate 33 is fixed on an upper surface of the bottom wall of the upper case 30 to fully cover the rectangular opening. Accordingly, the upper and lower cases 30 and 31 are partitioned by the transparent plate 33. The lower case 31 is gastight and hermetic except at the absorber holes 32, and connected to a vacuum device 9 (see FIG. 1) via a tube 8. When the vacuum device 9 is operated to evacuate the inside of the lower case 31, the soldering balls 1 are vacuum-absorbed to the absorber holes 32. The upper and lower cases 30 and 31 are so arranged that no light enters thereinto from the exterior through other than the absorber holes 32.

As shown in FIG. 2, a first reflector film 34 having a gradual curved surface is arranged just above the transparent plate 33. A second reflector film 35 also having a gradual curved surface is further provided spacing a given distance from the first reflector film 34. Further, a photo sensor 36 is disposed near the second reflector film 35 and at a side wall of the upper case 30. Accordingly, as shown by arrows in FIG. 2, light entering the lower case 31 via at least one of the absorber holes 32 is reflected by the first reflector film 34 to be condensed onto the second reflector film 35, and then, as shown in FIG. 3, the light is reflected by the second reflector film 35 to be condensed onto the photo sensor 36. As shown in FIG. 3, the photo sensor 36 is connected to a leakage-light detecting section 37 which, in turn, is connected to a control section 38.

The first reflector film 34 and the second reflector film 35 each have the same optical characteristic as a reflector film 58 in a later-described second embodiment of the present invention. Details thereof will be described in the second embodiment.

In FIG. 1, a light emitter 40 is arranged between the feed container 21 and the positioning section 26 for the substrate 5. As shown in FIG. 4, the light emitter 40 is in the form of a rectangular box base 41 with a line light source 42 arranged thereon. A pair of upright plates 43 and 44 are fixed on both side surfaces of the base 41. The upright plates 43 and 44 are provided with a light-emitting element 45 and a light-receiving element 46, respectively. The light-emitting and light-receiving elements 45 and 46 are connected via cords 47 to a soldering ball detecting section 48 which, in turn, is connected to a control section 49.

In FIG. 4, the line light source 42 extends in the Y direction which is orthogonal to the moving directions (X directions) of the pickup head 11. With this arrangement, light from the line light source 42 is irradiated onto all the bottom surface of the pickup head 11 upon movement of the pickup head 11 in the X direction toward the clamping section 26. Further, the light-emitting element 45 and the light-receiving element 46 are so arranged as to sandwich the moving path of the pickup head 11. Accordingly, as shown in FIG. 5, when at least one soldering ball 1 is attached to the absorber hole 32, a light path between the light-emitting and light-receiving elements 45 and 46 is intercepted so that the light is not received by the light-receiving element 46.

Now, an operation of the soldering ball mounting apparatus having the foregoing structure will be described hereinbelow.

In FIG. 1, when the motor 17 is rotated in the forward direction in the state where the pickup head 11 is located at the initial position just above the feed container 21, the pickup head 11 is lowered to the given low level to pick up the soldering balls 1 stored in the feed container 21 by vacuum-absorbing them at the bottom surface thereof. At this time, as described before, the gas from the gas blowing unit 25 is introduced into the feed container 21 to cause the soldering balls 1 in the feed container 21 to be mobile for facilitating the absorption of the soldering balls 1 to all the absorber holes 32. Thereafter, the motor 17 is rotated in the reverse direction to raise the pickup head 11 to the initial position.

Subsequently, the motor 20 is rotated in the forward direction to move the pickup head 11 toward the clamping section 26, that is, the substrate 5. On the midway to the substrate 5, as shown in FIG. 4, the pickup head 11 passes over the light emitter 40. At this time, the light is irradiated from the line light source 42 onto the pickup head 11. As shown in FIG. 2, when there is at least one absorber hole 32 absorbing no soldering ball 1, the light from the line light source 42 leaks into the lower case 31 via the absorber hole 32 holding no soldering ball 1, and then reflected by the first and second reflector films 34 and 35 so as to enter the photo sensor 36 (see arrows in FIGS. 2 and 3). An output signal of the photo sensor 36 is inputted to the leakage-light detecting section 37 so that presence of at least one absorber hole 32 holding no soldering ball 1, that is, presence of the soldering ball pickup error, is found.

In this case, the motor 20 is rotated in the reverse direction under a command from the control section 38 so that the pickup head 11 is returned to the initial position where the pickup head 11 repeats the operation of picking up the soldering balls 1 as described before. The pickup head 11 again passes over the line light source 42 where presence of leakage light is again checked. If no leakage light is detected by the leakage-light detecting section 37, meaning that all the absorber holes 32 hold the soldering balls 1 in position, the pickup head 11 is further moved to arrive just above the substrate 5. Subsequently, the motor 17 is rotated in the forward direction to lower the pickup head 11 to a given low level where the vacuum condition in the lower case 31 is released by closing a valve (not shown) provided in the tube 8 so that the soldering balls 1 are released and mounted onto given portions on the substrate 5. As appreciated, flux is applied to the substrate 5 in advance so that the soldering balls 1 are firmly bonded on the substrate 5.

Thereafter, the pickup head 11 is raised and moved horizontally toward the initial position just above the feed container 21. On the midway to the initial position, the pickup head passes over the light emitter 40. At this time, as shown in FIG. 5, when light emitted from the light-emitting element 45 is not received by the light-receiving element 46, the soldering ball detecting section 48 detects this. Thus, it is determined that at least one soldering ball 1 remains attached to the absorber hole 32. The remaining soldering ball 1 is a result of failure of mounting onto the substrate 5 so that the mounting error is determined and the processed substrate 5 is removed from the production line under a command from the control section 49 as being defective. On the other hand, the non-defective substrate 5 is transferred to the reflow apparatus where the bumps are formed by heating the soldering balls 1.

Figure 6:
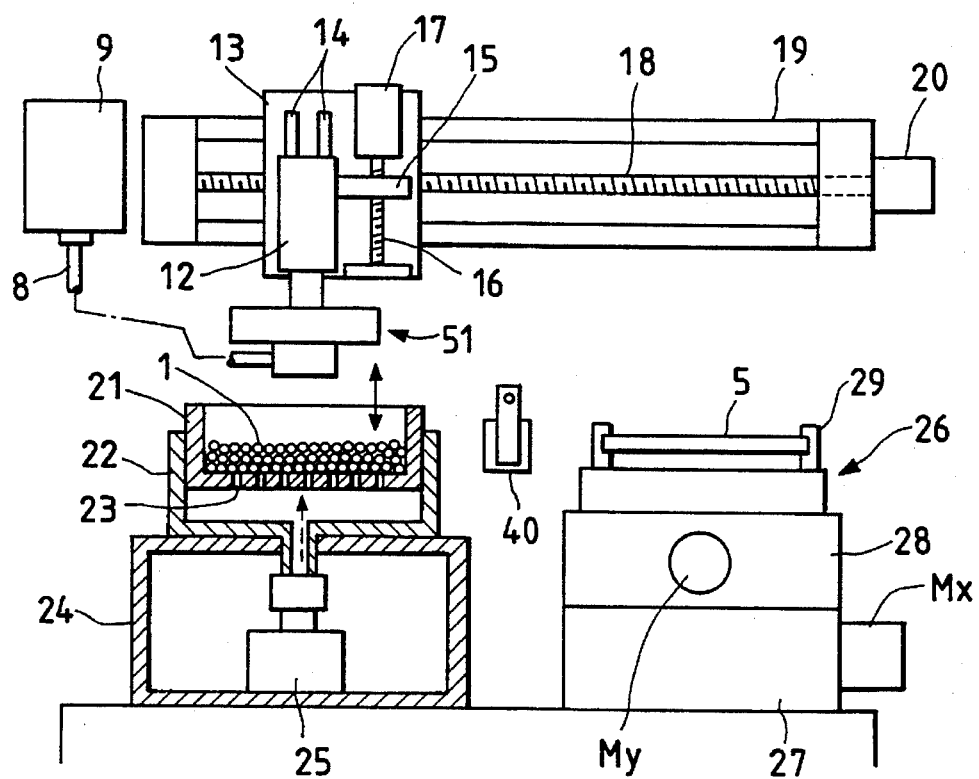
FIG. 6 is a side view showing a soldering ball mounting apparatus according to a second embodiment of the present invention.
Figure 7:
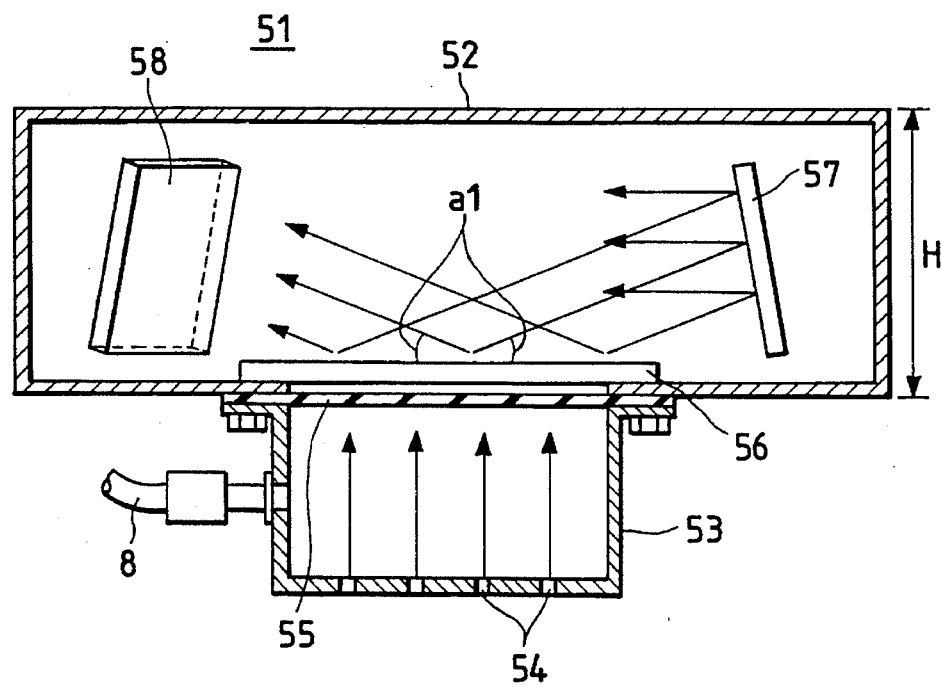
FIG. 7 is a vertical sectional view of a pickup head incorporated in the soldering ball mounting apparatus shown in FIG. 6.
Figure 8:
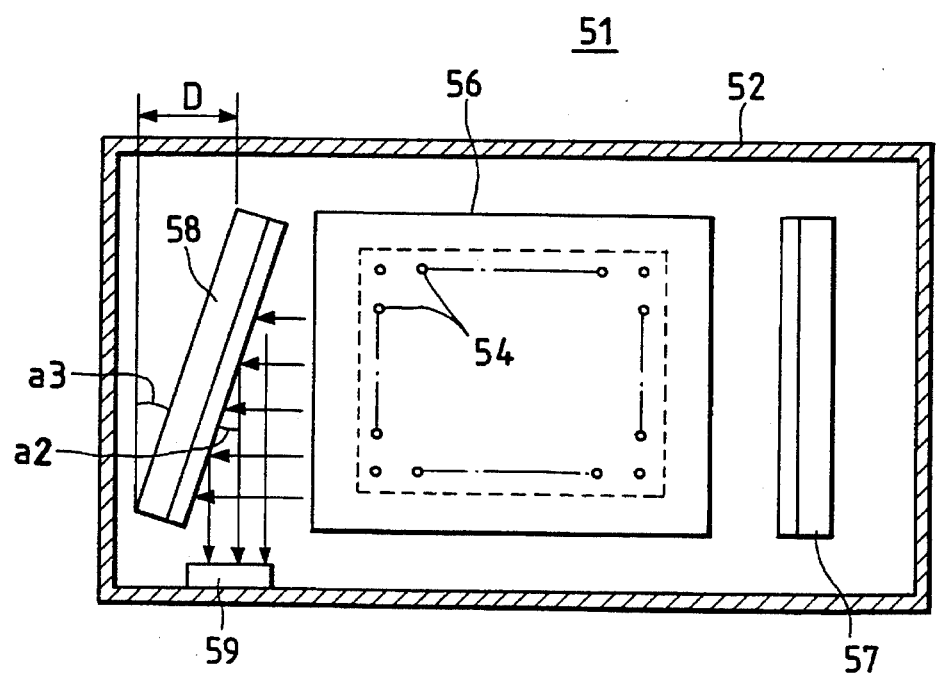
FIG. 8 is a horizontal sectional view of the pickup head shown in FIG. 7.
Figure 9:
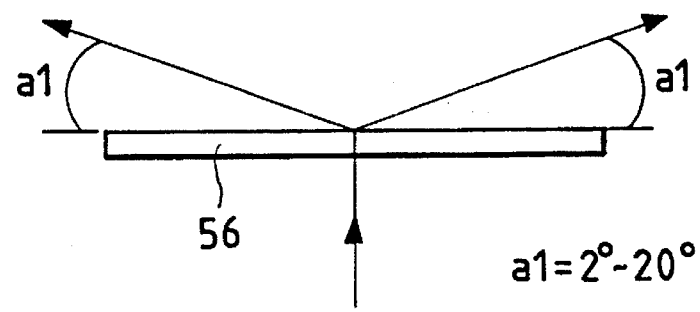
FIGS. 9 and 10 are explanatory diagrams for a transparent film, respectively, incorporated in the pickup head shown in FIGS. 6–8.
Figure 10:
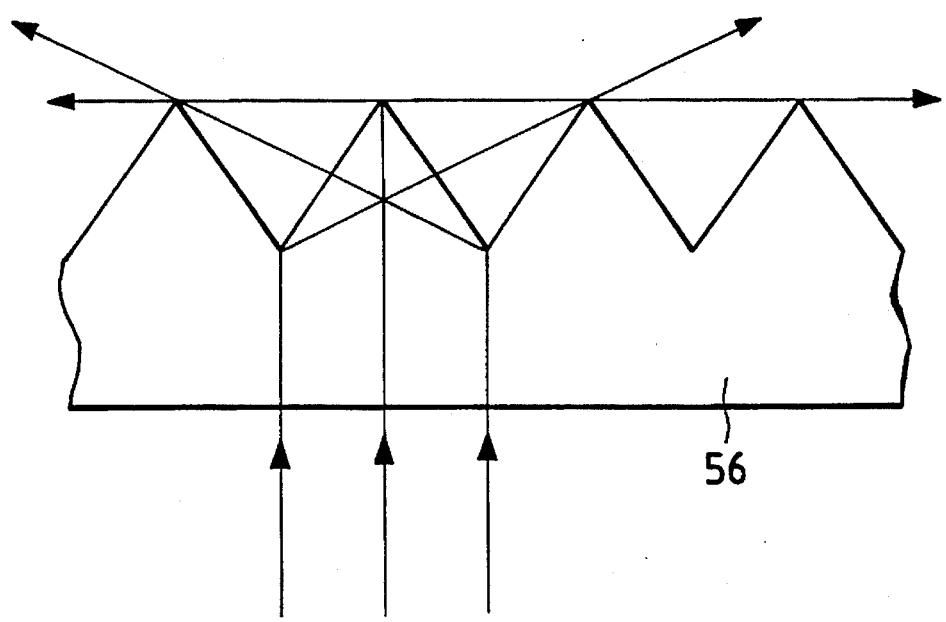
Figure 11:
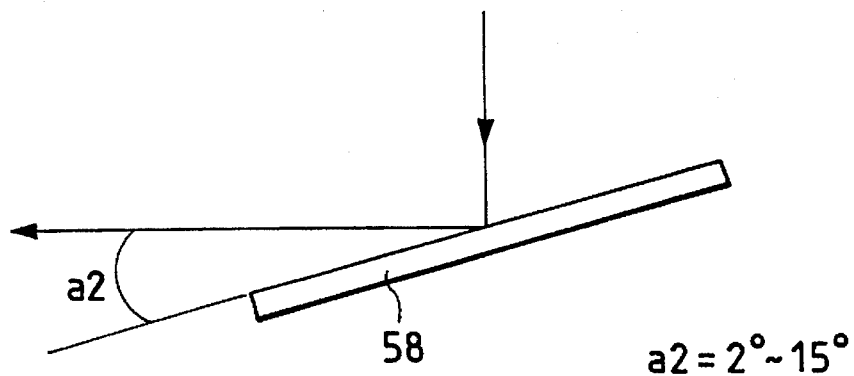
FIGS. 11 and 12 are explanatory diagrams for a reflector film, respectively, incorporated in the pickup head shown in FIGS. 6–8.
Figure 12:
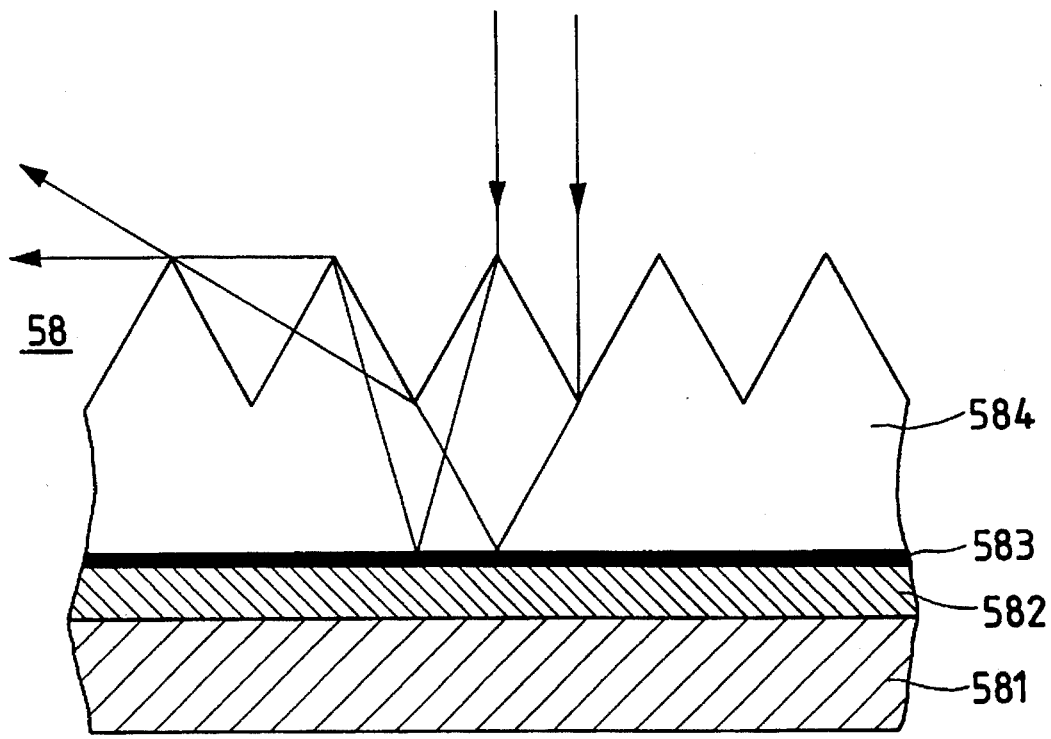

Now, a second embodiment of the present invention will be described hereinbelow. FIG. 6 is a side view showing a soldering ball mounting apparatus according to a second embodiment of the present invention. FIG. 7 is a vertical sectional view of a pickup head incorporated in the soldering ball mounting apparatus shown in FIG. 6. FIG. 8 is a horizontal sectional view of the pickup head shown in FIG. 7. FIGS. 9 and 10 are explanatory diagrams for a transparent film, respectively, incorporated in the pickup head shown in FIGS. 6–8. FIGS. 11 and 12 are explanatory diagrams for a reflector film, respectively, incorporated in the pickup head shown in FIGS. 6–8.

The soldering ball mounting apparatus shown in FIG. 6 differs from that shown in FIG. 1 only in a structure of the pickup head 51.

In FIGS. 7 and 8, the pickup head 51 is in the form of a dark box constituted by an upper case 52 and a lower case 53 which are fixed together by bolts with a transparent plate 55 interposed therebetween. The lower case 53 has a bottom wall which is formed with a large number of absorber openings or holes 54, arranged in a matrix, for vacuum-absorbing the soldering balls 1. The lower case 53 is gastight and hermetic except at the absorber holes 54, and connected to the vacuum device 9 (see FIG. 6) via the tube 8. When the vacuum device 9 is operated to evacuate the inside of the lower case 53, the soldering balls 1 are vacuum-absorbed to the absorber holes 54. The upper and lower cases 52 and 53 are so arranged that no light enters thereinto from the exterior through other than the absorber holes 54.

As shown in FIG. 7, a transparent film 56 is disposed on an upper surface of a bottom wall of the upper case 52 just above the transparent plate 55 so as to fully cover a rectangular opening formed at the bottom wall of the upper case 52. In the upper case 52, a reflector plate 57 is provided in a somewhat inclined posture, and the reflector film 58 is further provided in a somewhat inclined posture spacing a given distance from the reflector plate 57. As shown in FIG. 8, a light detecting sensor 59 is disposed near the reflector film 58 and at a side wall of the upper case 52.

FIGS. 9 and 10 show an optical characteristic of the transparent film 56, wherein FIG. 9 is a sectional view of the transparent film 56 and FIG. 10 is an enlarged sectional view thereof. As shown in FIG. 10, an upper surface of the transparent film 56 is formed as a prism surface such that the light incident upon the transparent film 56 from below is refracted by the prism surface to be directed toward opposite sides or in opposite directions. Accordingly, as shown in FIG. 9, the light incident upon the transparent film 56 from below is, as a whole, directed in the opposite directions, that is, toward the right and left directions in FIG. 9, at an acute angle a1 which is about 2° to 20°.

FIGS. 11 and 12 show an optical characteristic of the reflector film 58, wherein FIG. 11 is a sectional view of the reflector film 58 and FIG. 12 is an enlarged sectional view thereof. As shown in FIG. 12, the reflector film 58 is formed by stacking, on a plate 581, an adhesive layer 582, an aluminum deposited layer 583 and a prism layer 584 in the order named. Accordingly, the light incident upon the reflector film 58 from above in FIG. 12 is first refracted by the prism layer 584, reflected by the aluminum deposited layer 583 and then goes out of the prism layer 584 being again refracted. As shown in FIG. 11, the light incident upon the reflector film 58 from above is, as a whole, reflected toward one side at an acute angle a2 which is about 2° to 15°.

In FIG. 7, since the transparent film 56 has the foregoing optical characteristic, the light entering the lower case 53 via at least one of the absorber holes 54 is directed toward the opposite sides at the acute angle a1 via the transparent film 56. The light directed rightward in FIG. 7 is reflected by the reflector plate 57 toward the reflector film 58. On the other hand, the light directed leftward in FIG. 7 is directly incident upon the reflector film 58. Since the transparent film 56 has the optical characteristic so as to refract the incident light at the acute angle a1, a height H, shown in FIG. 7, of the upper case 52 can be set smaller to realize size-reduction of the upper case 52.

In FIG. 8, the light incident upon the reflector film 58 via the transparent film 56 and the reflector plate 57 are reflected toward one side at the acute angle a2 to be incident upon the light detecting sensor 59. Since the reflector film 58 reflects the incident light at the acute angle a2, the upper case 52 can be further reduced in size by arranging the reflector film 58 at an acute angle a3 so as to diminish a length D in FIG. 8. Accordingly, the transparent film 56 and the reflector film 58 work as directional optical elements to refract and reflect the light at the acute angles for achieving the size-reduction of the pickup head 51.

As described above, by using the foregoing transparent film 56 and reflector film 58 as optical elements for leading the light entering the lower case 53 via the absorber holes 54 to the light detecting sensor 59, the upper case 52 can be reduced in size, thereby further realizing the size-reduction of the pickup head 51.

An operation of the soldering ball mounting apparatus of the second embodiment is the same as that of the foregoing first embodiment. Specifically, like the first embodiment as shown in FIG. 4, the soldering-ball pickup error is monitored by observing presence or absence of the leakage light via at least one of the absorber holes 54 using the light detecting sensor 59 when the pickup head 51 passes over the light emitter 40 toward the substrate 5. Further, like the first embodiment as shown in FIG. 5, the soldering-ball mounting error is monitored by observing whether the light emitted from the light-emitting element 45 is received by the light-receiving element 46 when the pickup head 51 passes over the light emitter 40 toward the initial position after mounting the soldering balls 1 onto the substrate 5.

Figure 13:
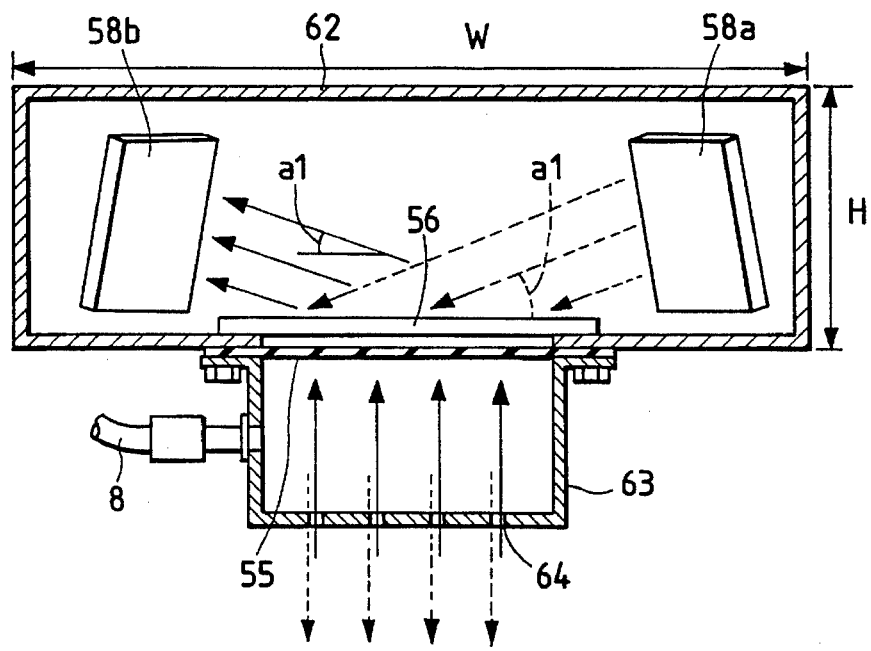
FIG. 13 is a vertical sectional view of a pickup head incorporated in a soldering ball mounting apparatus according to a third embodiment of the present invention.
Figure 14:
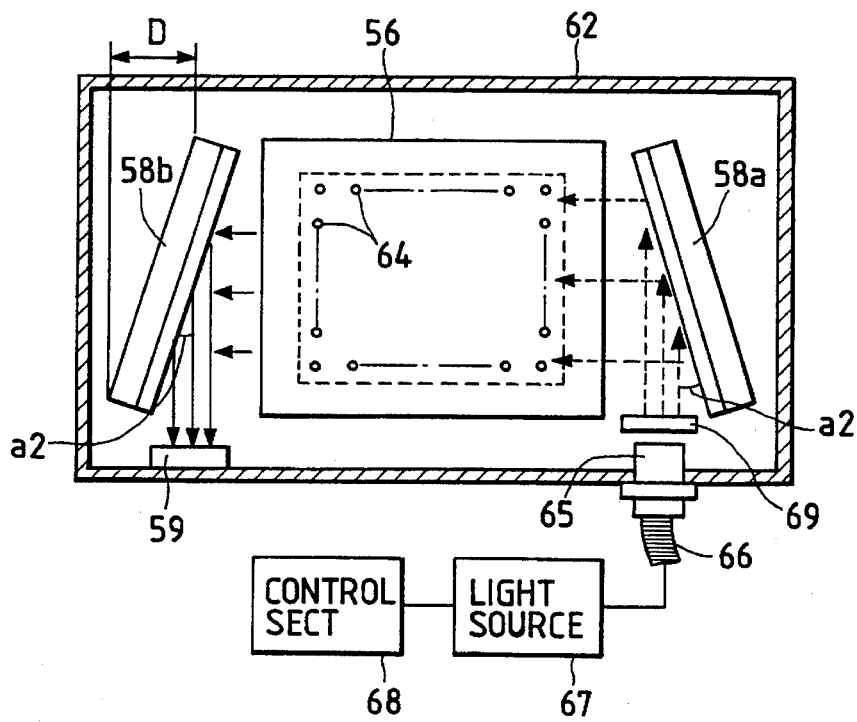
FIG. 14 is a horizontal sectional view of the pickup head shown in FIG. 13.
Figure 15:
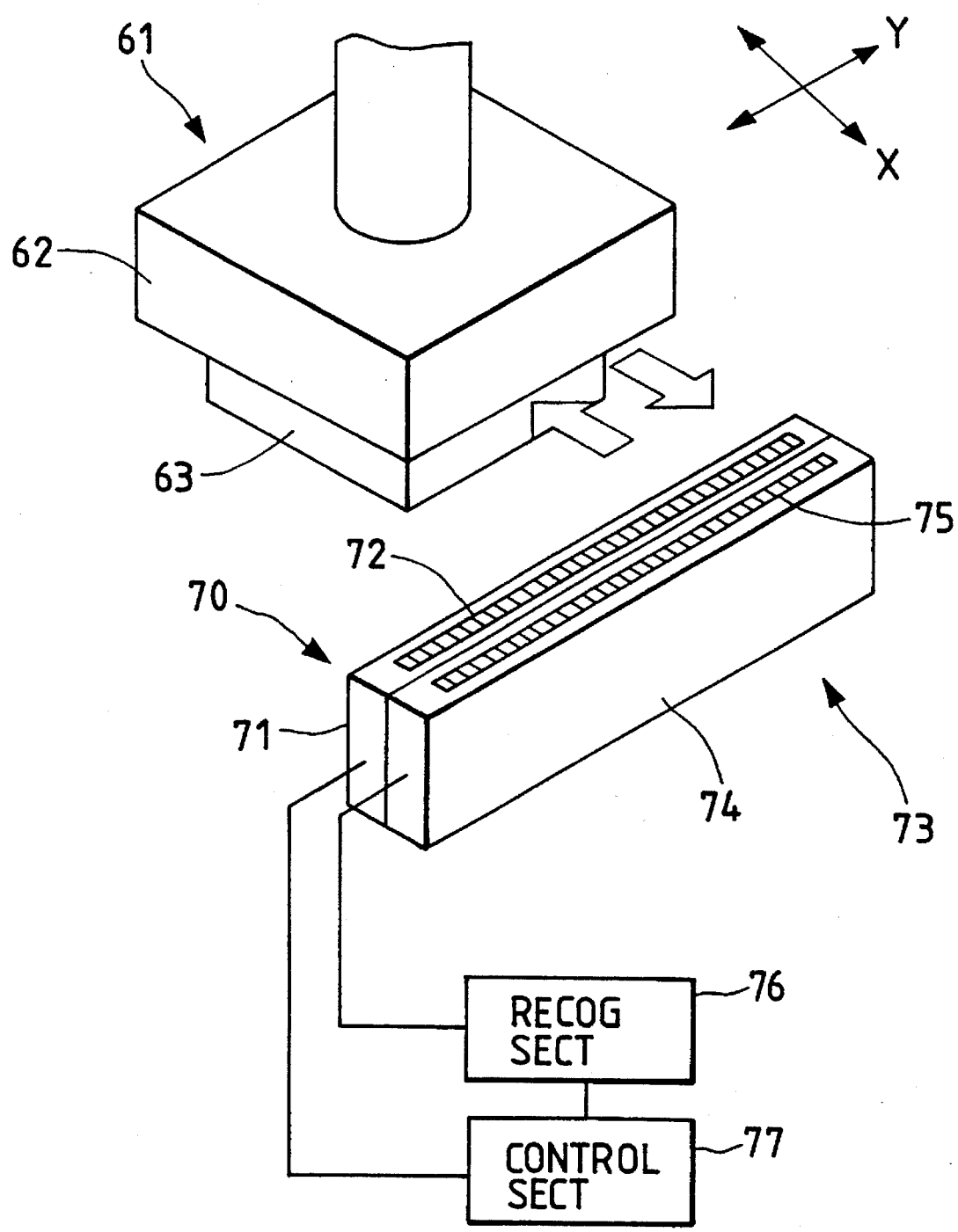
FIG. 15 is a perspective view showing the pickup head shown in FIGS. 13 and 14, a light emitter and a light receiver incorporated in the soldering ball mounting apparatus according to the third embodiment.

Now, a third embodiment of the present invention will be described hereinbelow. FIG. 13 is a vertical sectional view of a pickup head incorporated in a soldering ball mounting apparatus according to the third embodiment. FIG. 14 is a horizontal sectional view of the pickup head shown in FIG. 13. FIG. 15 is a perspective view showing the pickup head shown in FIGS. 13 and 14, a light emitter and a light receiver incorporated in the soldering ball mounting apparatus according to the third embodiment.

The soldering ball mounting apparatus according to the third embodiment differs from that shown in FIG. 1 only in structures of the pickup head, the light emitter and the light receiver.

In FIGS. 13 and 14, the pickup head 61 is in the form of a dark box constituted by an upper case 62 and a lower case 63 which are fixed together by bolts with the transparent plate 55 interposed therebetween. The lower case 63 has a bottom wall which is formed with a large number of absorber openings or holes 64, arranged in a matrix, for vacuum-absorbing the soldering balls 1. The lower case 63 is gastight and hermetic except at the absorber holes 64, and connected to the vacuum device 9 (see FIG. 1) via the tube 8. When the vacuum device 9 is operated to evacuate the inside of the lower case 63, the soldering balls 1 are vacuum-absorbed to the absorber holes 64. The upper and lower cases 62 and 63 are so arranged that no light enters thereinto from the exterior through other than the absorber holes 64 and a later-described nozzle 65.

As shown in FIG. 13, the transparent film 56 is disposed on an upper surface of a bottom wall of the upper case 62 just above the transparent plate 55 so as to fully cover a rectangular opening formed at the bottom wall of the upper case 62. In the upper case 62, first and second reflector films 58a and 58b are disposed on opposite sides spacing a given distance from each other. Each of the first and second reflector films 58a and 58b is arranged in a somewhat inclined posture, and is the same as the reflector film 58 in the foregoing second embodiment.

In FIG. 14, the nozzle 65 is mounted at a side wall of the upper case 62. The nozzle 65 holds one end of optical fiber 66 connected at its other end to a light source 67 such that light emitted from the light source 67 and conducted through the optical fiber 66 is directed toward the first reflector film 58a. Numeral 68 denotes a control section for controlling an operation of the light source 67.

In FIG. 15, numeral 70 denotes the light emitter having a base 71 with a line light source 72 arranged thereon. Numeral 73 denotes the light receiver having a base 74 with a line sensor 75 arranged thereon. The light emitter 70 and the light receiver 73 are arranged under the moving path of the pickup head 61 instead of the light emitter 40 in the first embodiment shown in FIG. 1. Numeral 76 denotes a recognition section connected to the light receiver 73, and numeral 77 denotes a control section for controlling operations of the light emitter 70, the light receiver 73 and the recognition section 76.

In the soldering ball mounting apparatus according to the third embodiment, the soldering-ball pickup error is monitored in the following manner: As shown in FIG. 15, the pickup head 61, after picking up the soldering balls 1 from the feed container 21, passes over the light emitter 70. At this time, the control section 77 controls the line light source 72 to irradiate light toward the bottom surface of the pickup head 61. In FIGS. 13 and 14, when at least one of the absorber holes 64 absorbs no soldering ball 1, the light leaking into the lower case 63 via the absorber hole 64 is refracted by the transparent film 56 to advance toward the second reflector film 58b at the acute angle a1 and then reflected by the second reflector film 58 at the acute angle a2 so as to be incident upon the light detecting sensor 59, as shown by solid-line arrows in FIGS. 13 and 14. Accordingly, the soldering-ball pickup error is detected.

By using the transparent film 56 and the reflector film 58b, a length D shown in FIG. 14 and thus a width W of the upper case 62 shown in FIG. 13 as well as a height H of the upper case 62 can be diminished to realize the size-reduction of the pickup head 61.

Further, the soldering-ball mounting error is monitored in the following manner: As shown in FIG. 15, the pickup head 61, after mounting the soldering balls 1 onto the substrate 5, passes over the light receiver 73 on the way to the initial position just above the feed container 21. At this time, the control section 68 controls the light source 67 to emit light so that the light is irradiated toward the first reflector film 58a via the nozzle 65, as shown by broken-line arrows in FIG. 14. The light is uniformly diffused via a diffuser plate 69 so as to be incident upon the first reflector film 58a at the acute angle a2. As shown in FIG. 13, the light is reflected by the first reflector film 58a to be incident upon the transparent film 56 at the acute angle a1 where the light is refracted, then enters the lower case 63 and leaks out of the lower case 63 downward via the absorber holes 64, as shown by broken-line arrows in FIG. 13.

In FIG. 15, the line sensor 75 of the light receiver 74 receives the light leaking via the absorber holes 64 and produces a corresponding output signal which is inputted to the recognition section 76. The control section 77 analyzes the signal inputted to the recognition section 76 and determines presence or absence of the soldering-ball mounting error. Specifically, when the light leaks through all the absorber holes 64, absence of the soldering-ball mounting error is determined. On the other hand, when no light leaks through at least one of the absorber holes 64, meaning that the soldering ball 1 is attached to that absorber hole, presence of the mounting error is determined.

Further, when no light is received through the absorber hole or holes 64 due to plugging thereof with dust or the like, it is also detected by the control section 77 via the recognition section 76 as presence of the soldering-ball mounting error. When no light leaks through the same absorber hole or holes 64 in plural times in succession, it may be possible that such a hole or holes are plugged. Accordingly, in this case, it may be arranged to notify an operator using a buzzer or the like.

Figure 16:
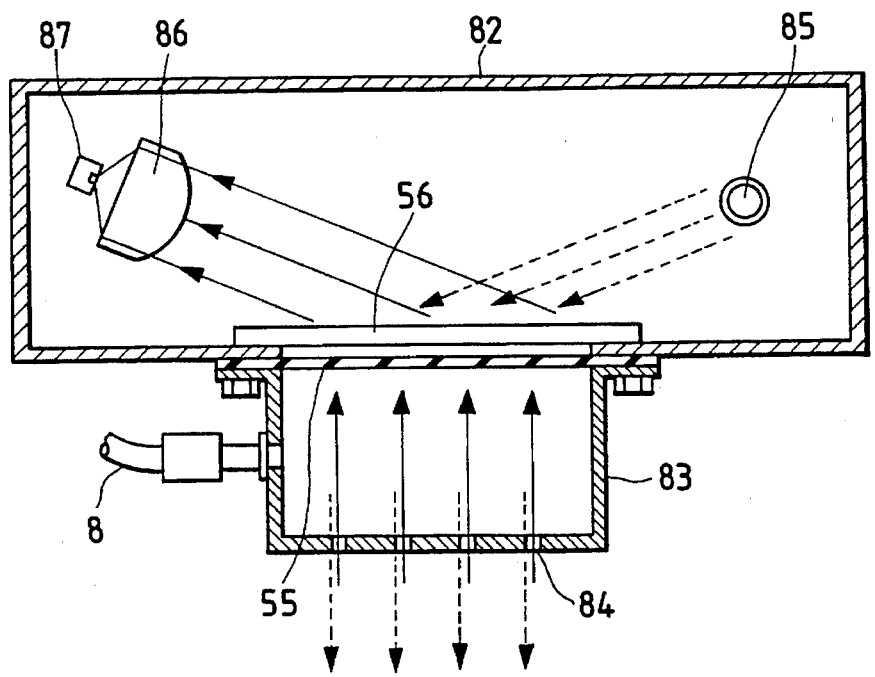
FIG. 16 is a vertical sectional view of a pickup head incorporated in a soldering ball mounting apparatus according to a fourth embodiment of the present invention.
Figure 17:
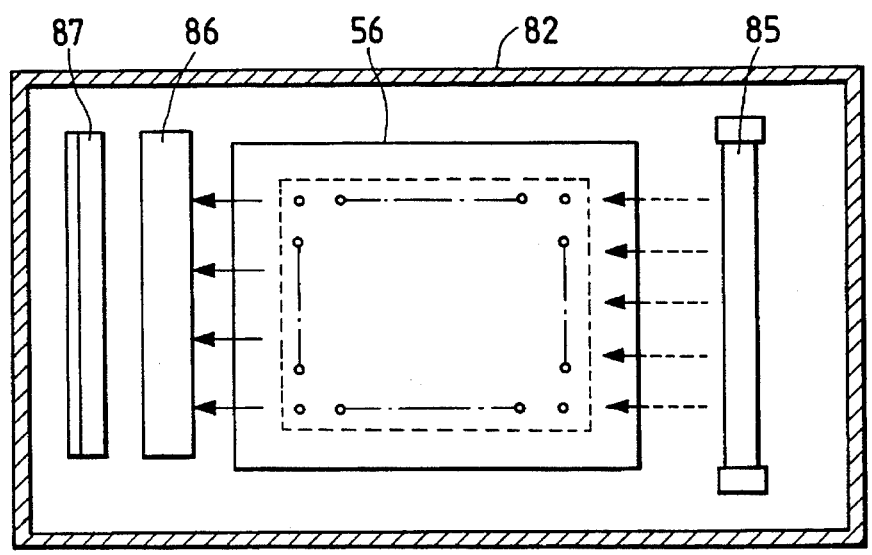
FIG. 17 is a horizontal sectional view of the pickup head shown in FIG. 16.
Figure 18:
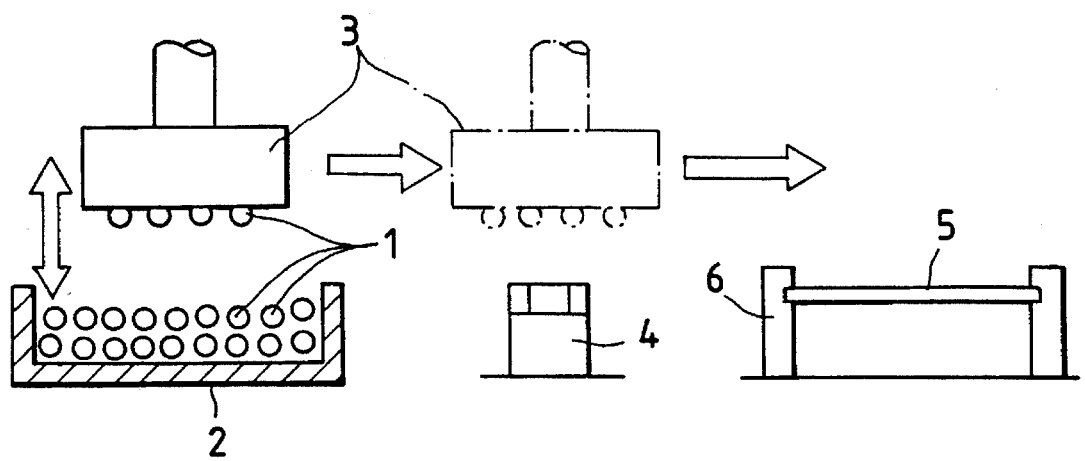
FIG. 18 is a side view schematically showing a conventional soldering ball mounting apparatus.

Now, a fourth embodiment of the present invention will be described hereinbelow. FIG. 16 is a vertical sectional view of a pickup head incorporated in a soldering ball mounting apparatus according to the fourth embodiment. FIG. 17 is a horizontal sectional view of the pickup head shown in FIG. 16.

The soldering ball mounting apparatus according to the fourth embodiment differs from that of the third embodiment only in a structure of the pickup head.

In FIGS. 16 and 17, the pickup head 81 is in the form of a dark box constituted by an upper case 82 and a lower case 83 which are fixed together by bolts with the transparent plate 55 interposed therebetween. The lower case 83 has a bottom wall which is formed with a large number of absorber openings or holes 84, arranged in a matrix, for vacuum-absorbing the soldering balls 1. The lower case 83 is gastight and hermetic except at the absorber holes 84, and connected to the vacuum device 9 (see FIG. 1) via the tube 8. When the vacuum device 9 is operated to evacuate the inside of the lower case 83, the soldering balls 1 are vacuum-absorbed to the absorber holes 84. The upper and lower cases 82 and 83 are so arranged that no light enters thereinto from the exterior through other than the absorber holes 84.

As shown in FIG. 16, the transparent film 56 is disposed on an upper surface of a bottom wall of the upper case 82 just above the transparent plate 55 so as to fully cover a rectangular opening formed at the bottom wall of the upper case 82. A bar-like light source 85 is disposed on one side in the upper case 82. A condenser lens 86 having a semicylindrical cross-section and a linear image sensor 87 are further provided on the opposite side in the upper case 82. The light source 85 is connected to a control section corresponding to the control section 68 in FIG. 14, and the linear image sensor 87 is connected to a leakage-light detecting section corresponding to the leakage-light detecting section 37 in FIG. 3, which, in turn, is connected to a control section corresponding to the control section 38 in FIG. 3.

Now, an operation of the soldering ball mounting apparatus of the fourth embodiment will be described hereinbelow.

The pickup head 81, after picking up the soldering balls 1 from the feed container 21, passes over the light emitter 70. At this time, the control section 77 controls the line light source 72 to irradiate light toward the bottom surface of the pickup head 81. The light leaking into the lower case 83 via at least one of the absorber holes 84 is refracted by the transparent film 56 to advance toward the condenser lens 86 at the acute angle a1. The light is then converged onto the linear image sensor 87 so that the soldering-ball pickup error is detected. On the other hand, the pickup head 81, after mounting the soldering balls 1 onto the substrate 5, passes over the light receiver 73 on the way to the initial position just above the feed container 21. At this time, the bar-like light source 85 is energized to emit light. As shown by broken-line arrows in FIGS. 16 and 17, the light is incident upon the transparent film 56 at the acute angle a1 and then leaks out via the absorber holes 84. Accordingly, like in the foregoing third embodiment, the light is received by the light receiver 73 so that presence or absence of the soldering-ball mounting error is determined.

The present invention is not limited to the foregoing embodiments. For example, in the first embodiment, a two-dimensional light source may be used instead of the line light source 42. Further, although the line light source 42, the light-emitting element 45 and the light-receiving element 46 are integrally provided in the first embodiment, these elements may be provided separately. Further, instead of the light receiver 73 with the line sensor 75 shown in FIG. 15, a CCD camera may be used to monitor the mounting error including the plugging of the absorber holes 64, 84 with dust based on image data obtained by the CCD camera. Further, a flux storage may be provided under the moving path of the pickup head. With this arrangement, the pickup head is vertically moved over the flux storage to apply flux slightly to the soldering balls absorbed at the bottom surface of the pickup head so that the soldering balls with flux are mounted onto the substrate. In this case, presence of the pickup error is checked twice in the foregoing manner, that is, after picking up the soldering balls from the feed container 21 and after applying the flux to the soldering balls. Further, instead of the substrates, the workpieces may be other electronic components, such as, chips for flip chips.

As described above, according to the foregoing embodiments of the present invention, presence or absence of the soldering-ball pickup error can be easily and reliably detected prior to mounting the soldering balls onto the substrate, and presence or absence of the soldering-ball mounting error can be easily and reliably detected after mounting the soldering balls onto the substrate.

While the present invention has been described in terms of the preferred embodiments, the invention is not to be limited thereto, but can be embodied in various ways without departing from the principle of the invention as defined in the appended claims.

What is claimed is:

1. A soldering ball mounting method in which a pickup head includes a bottom formed with a plurality of absorber holes for vacuum-absorbing soldering balls from a soldering ball feeder and mounting the soldering balls onto a workpiece, said method comprising the steps of:

monitoring the bottom of said pickup head after mounting the soldering balls onto said workpiece; and determining presence of a soldering-ball mounting error by said pickup head when at least one of the soldering balls is detected at the bottom of said pickup head.

2. A soldering ball mounting method in which a pickup head is movable along a moving path between a soldering ball feeder and a workpiece and includes a bottom formed with a plurality of absorber holes for vacuum-absorbing soldering balls from said soldering ball feeder and mounting the soldering balls onto said workpiece, said method comprising the steps of:

irradiating light toward the bottom of said pickup head while the pickup head moves from said soldering ball feeder to said workpiece for mounting the soldering balls onto said workpiece; and determining presence of a soldering-ball pickup error by said pickup head when the light leaking into said pickup head via at least one of said absorber holes is detected by light detecting means provided in said pickup head.

3. A soldering ball mounting method in which a pickup head includes a bottom formed with a plurality of absorber holes for vacuum-absorbing soldering balls from a soldering ball feeder and mounting the soldering balls onto a workpiece, said method comprising the steps of:

monitoring light emitted from light emitting means provided in said pickup head and leaking out of said pickup head via said absorber holes after mounting the soldering balls onto said workpiece; and determining presence of a soldering-ball mounting error by said pickup head when no leakage light is detected with respect to at least one of said absorber holes.

4. A soldering ball mounting apparatus comprising:

a pickup head movable along a moving path between a soldering ball feeder and a workpiece, said pickup head being in the form of a dark box having a bottom which is formed with a plurality of absorber holes for vacuum-absorbing soldering balls from said soldering ball feeder and mounting the soldering balls onto said workpiece; and detecting means provided near said moving path for irradiating light along the bottom of said pickup head while the pickup head returns from said workpiece to said soldering ball feeder after mounting the soldering balls onto said workpiece, and for detecting presence or absence of the soldering ball attached to the bottom of said pickup head based on presence or absence of interception of said irradiated light.

5. A soldering ball mounting apparatus comprising:

a pickup head movable along a moving path between a soldering ball feeder and a workpiece, said pickup head being in the form of a dark box having a bottom which is formed with a plurality of absorber holes for vacuum-absorbing soldering balls from said soldering ball feeder and mounting the soldering balls onto said workpiece;

light detecting means provided in said dark box for detecting light leaking into said dark box via at least one of said absorber holes;

light emitting means provided near said moving path for irradiating the light toward the bottom of said pickup head while the pickup head moves toward said workpiece for mounting the soldering balls onto said workpiece; and detecting means provided near said moving path for irradiating light along the bottom of said pickup head while the pickup head returns from said workpiece to said soldering ball feeder after mounting the soldering balls onto said workpiece, and for detecting presence or absence of the soldering ball attached to the bottom of said pickup head based on presence or absence of interception of the light irradiated along said bottom.

6. A soldering ball mounting apparatus comprising:

a pickup head movable along a moving path between a soldering ball feeder and a workpiece, said pickup head being in the form of a dark box having a bottom which is formed with a plurality of absorber holes for vacuum-absorbing soldering balls from said soldering ball feeder and mounting the soldering balls onto said workpiece;

light detecting means provided in said dark box for detecting light leaking into said dark box via at least one of said absorber holes;

first light emitting means provided in said dark box;

second light emitting means provided near said moving path for irradiating the light toward the bottom of said pickup head; and light receiving means provided near said moving path for detecting light emitted from said first light emitting means and leaking out of said dark box via said absorber holes.

7. A soldering ball mounting apparatus comprising:

a pickup head movable along a moving path between a soldering ball feeder and a workpiece, said pickup head being in the form of a dark box having a bottom which is formed with a plurality of absorber holes for vacuum-absorbing soldering balls from said soldering ball feeder and mounting the soldering balls onto said workpiece;

light detecting means provided in said dark box for detecting light leaking into said dark box via at least one of said absorber holes; and light emitting means provided near said moving path for irradiating the light toward the bottom of said pickup head.

8. The soldering ball mounting apparatus according to claim 7, wherein said light emitting means includes a line light source which extends in a direction orthogonal to said moving path of the pickup head.

9. The soldering ball mounting apparatus according to claim 7, wherein condenser means is provided in said dark box for condensing the light leaking into said dark box via said at least one of said absorber holes onto said light detecting means.

10. The soldering ball mounting apparatus according to claim 9, wherein said condenser means comprises a first reflector film arranged above said absorber holes and reflecting substantially horizontally the light leaking into said dark box via said at least one of said absorber holes, and a second reflector film spacing a given distance from said first reflector film and reflecting the light from said first reflector film toward said light detecting means.

11. The soldering ball mounting apparatus according to claim 2, wherein said condenser means comprises a transparent film arranged above said absorber holes and refracting the light leaking into said dark box via said at least one of said absorber holes obliquely upward at an acute angle, and a reflector film reflecting the light from said transparent film toward said light detecting means.

12. The soldering ball mounting apparatus according to claim 9, wherein said condenser means comprises a transparent film arranged above said absorber holes and refracting the light leaking into said dark box via said at least one of said absorber holes obliquely upward at an acute angle, and a lens condensing the light from said transparent film onto said light detecting means.

* * * * *